United States Patent
Murayama et al.

(10) Patent No.: US 7,829,993 B2
(45) Date of Patent: Nov. 9, 2010

(54) SEMICONDUCTOR APPARATUS

(75) Inventors: Kei Murayama, Nagano (JP); Akinori Shiraishi, Nagano (JP); Masahiro Sunohara, Nagano (JP); Yuichi Taguchi, Nagano (JP); Mitsutoshi Higashi, Nagano (JP)

(73) Assignee: Shinko Electric Industries Co., Ltd., Nagano-shi, Nagano (JP)

( * ) Notice: Subject to any disclaimer, the term of this patent is extended or adjusted under 35 U.S.C. 154(b) by 0 days.

(21) Appl. No.: 11/896,010

(22) Filed: Aug. 29, 2007

(65) Prior Publication Data
US 2008/0061424 A1    Mar. 13, 2008

(30) Foreign Application Priority Data
Sep. 7, 2006    (JP) ................... P.2006-242919

(51) Int. Cl.
*H01L 23/48* (2006.01)
(52) U.S. Cl. .............. 257/686; 257/678; 257/685; 257/690; 257/698; 257/723
(58) Field of Classification Search .......... 257/684, 257/678, 680, 686, 690, 693, 698, 704, 723; 438/106, 108, 116
See application file for complete search history.

(56) References Cited

U.S. PATENT DOCUMENTS

| 6,495,895 | B1 * | 12/2002 | Peterson et al. | 257/434 |
| 6,617,677 | B2 * | 9/2003 | Steffens | 257/684 |
| 6,674,159 | B1 * | 1/2004 | Peterson et al. | 257/680 |
| 7,423,336 | B2 * | 9/2008 | Corisis et al. | 257/686 |
| 2004/0173913 | A1 * | 9/2004 | Ohta | 257/777 |
| 2006/0216857 | A1 * | 9/2006 | Zhao | 438/106 |
| 2008/0029852 | A1 * | 2/2008 | Murayama et al. | 257/621 |

FOREIGN PATENT DOCUMENTS

JP    2004-281530    10/2004

* cited by examiner

*Primary Examiner*—David Vu
*Assistant Examiner*—Suberr Chi
(74) *Attorney, Agent, or Firm*—Drinker Biddle & Reath LLP

(57) ABSTRACT

A semiconductor apparatus comprising a silicon substrate; an device housing space including a concave portion formed in the silicon substrate and a hole perforating through the bottom surface of the concave portion; a plurality of laminated semiconductor devices provided in the device housing space; a first lid which lids the concave portion and a second lid which lids the hole, for sealing the semiconductor devices; and via plugs which are connected to the semiconductor devices, penetrating the bottom surface of the concave portion.

5 Claims, 9 Drawing Sheets

SEMICONDUCTOR APPARATUS

This application claims foreign priority based on Japanese Patent application No. 2006-242919, filed on Sep. 7, 2006, the contents of which is incorporated herein by reference in its entirety.

BACKGROUND OF THE INVENTION

1. Field of the Invention

The present invention relates to a semiconductor apparatus, a structure of a semiconductor device being sealed within a silicon substrate.

2. Description of the Related Art

Many types of packaging structures for semiconductor devices have been proposed, for example, some cases employ the semiconductor device with such a structure that the semiconductor device is sealed within a predetermined space. This makes a semiconductor device more stable, and more tolerant to deterioration thereof.

For example, to package MEMS (micro-electromechanical system) device as a packaged semiconductor device, a structure with having so called "cavity" is employed for accommodating the device within a predetermined space, and sealing it.

The MEMS device is generally used together with a driver device for the MEMS device. Therefore, in a semiconductor apparatus (package) using the MEMS device, both of the MEMS device and the driver device must be packaged.

Figure 1:
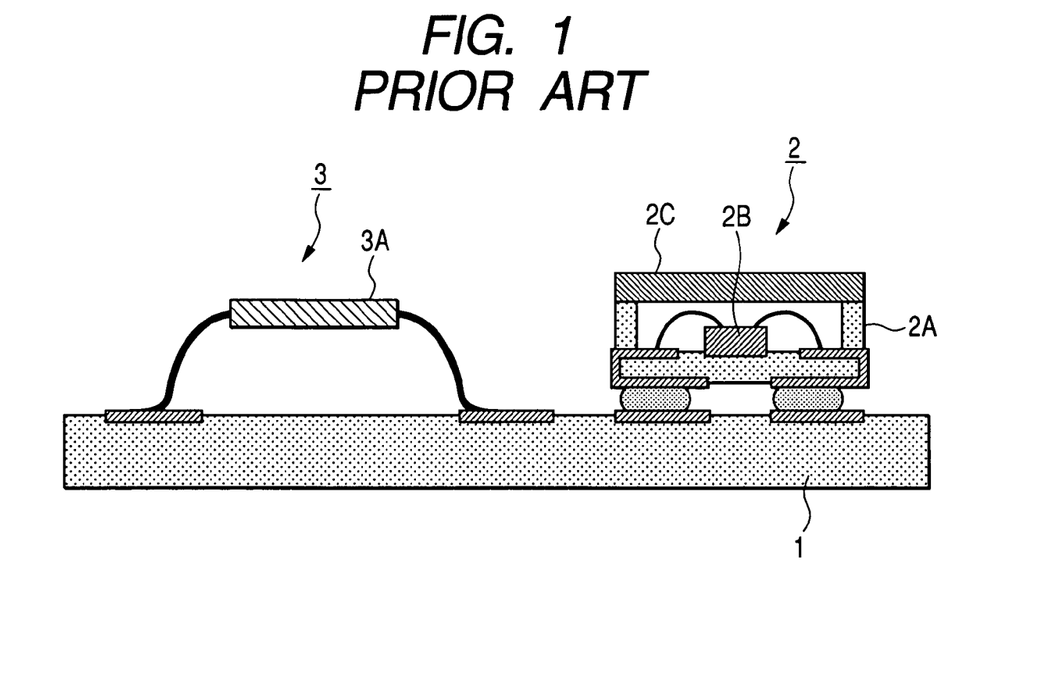
FIG. 1 shows a construction example of a conventional semiconductor apparatus.

FIG. 1 is an example of the structure for a semiconductor apparatus including a MEMS device. In the semiconductor apparatus shown in this figure, a MEMS part 2 and a driver 3 are mounted side by side on a substrate 1 which might be made of ceramic, for example.

The MEMS part 2 is structured so that a MEMS device 2B is accommodated inside a cavity 2A which is made of a ceramic material, the MEMS device is sealed by a lid 2C made of kovar. On the other hand, a driver device 3A is directly mounted on the substrate 1 such as disclosed in Japanese Published Unexamined Patent Application No. 2004-281530.

However, in the above-described semiconductor apparatus, since the MEMS device is sealed and packaged, while the driver device is packaged separately, it is difficult to downsize the semiconductor apparatus including the MEMS device. On top of this, as to the ceramic material forming the cavity and the substrate, this material is difficult to use for micromachining, which makes it difficult to downsize the semiconductor apparatus. This is partly because most of the ceramic package would shrink during the course of calcining due to its own property of material.

Alternatively, it is also considered to make the cavity by employing silicon, which is more suitable material for the usage of micromachining. However, a silicon wafer that is commercially available might be something in a range from 600 to 800 micrometers in thickness. In this regard, it is practically difficult to form the depth of the concave portion that is adequate for packaging the semiconductor devices as described above.

Although it would be possible to form the concave portion deeply enough for the above mentioned purpose in case of using a special thick substrate which is formed thicker than that of being generally easily to obtain, the cost for manufacturing such a semiconductor substrate would become more high, which is not realistic when considering productivity at the time of mass production.

More overly, even if one attempts to deeply form the concave portion, variation in the shape (depth and angle, etc.) of the concave portions increases, which lowers the yield (productivity) of the semiconductor apparatus to be formed.

SUMMARY OF THE INVENTION

An overall object of the present invention is to provide a new and useful semiconductor apparatus to solve the above-described problems.

A detailed object of the present invention is to downsize a semiconductor apparatus having a structure in which a semiconductor device is sealed.

The present invention achieves the objects by a semiconductor apparatus including: a silicon substrate; an device housing space including a concave portion formed in the silicon substrate and a hole perforating through the bottom surface of the concave portion; a plurality of laminated semiconductor devices provided in the device housing space; a first lid which seals the concave portion and a second lid which seals the hole so as to seal the semiconductor devices in the device housing space; and via plugs which are connected to any one of the plurality of semiconductor devices with penetrating the bottom surface of the concave portion.

According to the present invention, it becomes possible to downsize the semiconductor apparatus having a structure in which semiconductor devices are sealed.

In addition, when the plurality of semiconductor devices include a MEMS device and a driver device used for the MEMS device, it becomes possible to downsize the semiconductor apparatus including the MEMS device.

In addition, when the driver device is connected to the via plugs on a side where the MEMS device is laminated, the semiconductor apparatus can be further downsized.

When the first lid and the second lid are made of glass, their bonding to the silicon substrate becomes easy.

When the first lid and the second lid are bonded to the silicon substrate by anodic bonding, the semiconductor devices can be sealed within a clean space.

According to the present invention, it becomes possible to downsize a semiconductor apparatus having a structure in which semiconductor devices are sealed.

DESCRIPTION OF THE PREFERRED EMBODIMENTS

Embodiments of the present invention will be described hereinbelow by reference to the drawings. Unless otherwise specifically defined in the specification, terms have their ordinary meaning as would be understood by those of ordinary skill in the art.

Example 1

Figure 2:
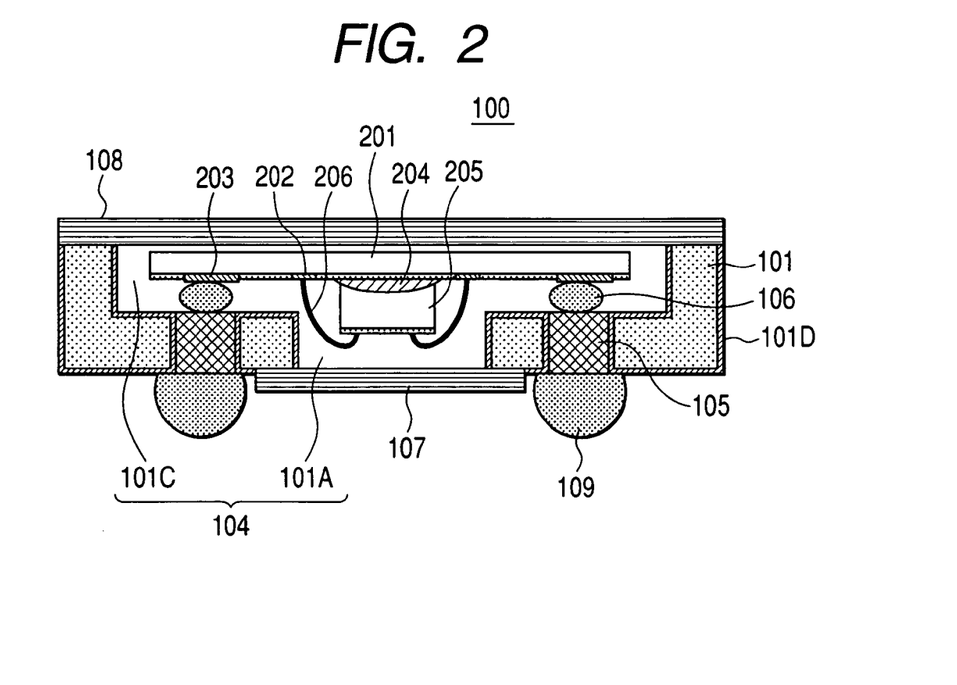
FIG. 2 shows a semiconductor apparatus of Example 1.

FIG. 2 is a sectional view schematically showing a semiconductor apparatus 100 of Example 1 of the present invention. Referring to FIG. 2, the semiconductor apparatus of this embodiment is generally structured so that laminated semiconductor devices 201 and 205 are sealed within an device housing space 104 perforating through a silicon substrate 101, formed in the silicon substrate 101, by a lid 107 and a lid 108.

The above-described device housing space 104 includes a concave portion 101C formed in the silicon substrate 101, and a hole 101A perforating through the silicon substrate 101 on the bottom surface side of the concave portion 101C. That is, the opening area of the hole 101A in a plan view is smaller than that of the concave portion 101C.

Furthermore, on the bottom surface side of the concave portion 101C, via plugs 105 penetrating the silicon substrate 101 are formed, and the via plugs 105 and the semiconductor device 201 are electrically connected by means of bumps 106.

The lid 107 is made of, for example, glass, and bonded (anodic bonding) to the silicon substrate 101 so as to seal the opening of the hole 101A. Similarly, the lid 108 is made of, for example, glass, and bonded (anodic bonding) to the silicon substrate 101 so as to seal the opening of the concave portion 101C.

Concerning the semiconductor devices 201 and 205, for example, the semiconductor device 205 is formed of a MEMS (micro-electromechanical system) device, and the semiconductor device 201 is formed of a driver device for the MEMS device.

The semiconductor device (MEMS device) 205 is bonded to be laminated on the semiconductor device (driver device 201) by paste (Ag paste or the like) 204, for example. Furthermore, a wire 206 connects the semiconductor device 205 and an electrode pad 202 which is formed on a surface extended from the surface where the semiconductor device 201 is bonded to the semiconductor device 205.

On the semiconductor device 201, an electrode pad 203 is formed on the same surface on which the electrode pad 202 is formed. The electrode pads 203 are connected to the via plugs 105 by means of bumps 106 as aforementioned. That is, the semiconductor device 201 is connected to the via plugs 105 on the side of lamination of the semiconductor device 205.

Generally, the MEMS device (semiconductor device 205) is smaller than the driver device (semiconductor device 201). In this regard, it is preferable to seal the MEMS device and the driver device in a way such that the MEMS device is laminated and mounted in the hole 101A and the driver device is laminated and mounted in the concave portion 101C. In this case, it becomes also preferable for the connections between the driver device and the via plugs 105.

Further, on a side opposite to the side with the bumps 106 being formed on the via plugs 105, namely, outside of the device housing space 104, a bump 109 is formed so that the semiconductor apparatus 100 (semiconductor device 201) can be readily connected to a connecting object such as a board.

As for the surfaces of the silicon substrate 101, they are insulated by an insulating film 101D which is formed of a silicon oxide film, for example, except for the surfaces bonded to the lids 107 and 108. This structure secures the insulation between the via plugs 105 and the silicon substrate 101.

the features of the above-described semiconductor apparatus 100 resides at using silicon, which is more suitable for micromachining, as a material for forming the housing space 104 where the semiconductor devices 201 and 205 are sealed. Therefore, in comparison with a conventionally used ceramic material, accuracy in micromachining such as for etching can be improved, which allows the semiconductor apparatus to be downsizes and refined. Silicon is higher in heat transfer coefficient than a ceramic material, so that it also becomes possible to efficiently cool down the heat of the high-performance semiconductor device.

However, on the other hand, since a silicon substrate that can be generally available for low cost is limited to those with approximately 600 to 800 micrometers in thickness. In this regard, it is difficult for such substrates to form a concave portion deep enough for the semiconductor devices being packaged in the above-mentioned way.

Further, even if a special substrate with having thickness thicker than that of the silicon wafer generally available as already discussed can be obtained, which makes it possible to form the deep concave portion, the cost for manufacturing the semiconductor substrate increases. On top of this, it is not practical to use such a substrate when consideration is given to the productivity at the time of mass production. This is because as trying to form the concave portion deeper, the variation in the shape (depth, angle, etc.) of the concave portion more increases, resulting in lower yield or lower productivity of the semiconductor apparatus to be formed lowers.

Therefore, in the semiconductor apparatus 100 of this embodiment, the device housing space 104 is formed such as to perforate through the silicon substrate 101, and the semiconductor devices accommodated in the device housing space 104 can be sealed by the first lid 107 and the second lid 108. Therefore, this structure makes it possible to form the device housing space 104 deep enough to accommodate the laminated semiconductor devices 201 and 205. At the same time, since the device housing space 104 is formed so as to perforate through the silicon substrate 101, this brings about an advantage in that the variation in the depth of the device housing space 104 can be substantially eliminated.

Furthermore, the device housing space 104 is structured such that the concave portion 101C and the hole 101A are communicated with each other with having different opening areas in a plan view. This structure makes it possible to form the via plugs 105 penetrating the bottom surface of a part of the concave portion 101C that is offset from the hole 101A.

Therefore, connection between the sealed semiconductor device 201 and the outside of the semiconductor housing space 104 can be secured.

By employing the above-described structure, even when a silicon wafer that is readily and inexpensively available is used as the silicon substrate, it becomes possible to secure a large device housing space 104. Therefore, downsizing of the semiconductor apparatus can be made at low cost for the semiconductor apparatus in which a plurality of laminated semiconductor devices are sealed, such as an example of sealing MEMS device and the driver device for the MEMS device.

As for the examples of the MEMS device that can be packaged as the semiconductor device 205, they might be an acceleration sensor, a temperature sensor, a humidity sensor, or the like. Turning to an example of the driver device that can be packaged as the semiconductor device 201, given that the MEMS device is an device including an acceleration sensor, the driver might be the devices including a circuit applying a predetermined reference voltage to the acceleration sensor, or a circuit outputting a capacitance change as a voltage from the acceleration sensor.

Next, an example of a method for producing the semiconductor apparatus 100 will be described with reference to FIG. 3A through FIG. 3K and FIG. 4A through FIG. 4D. In the following drawings, the components described above are attached with the same reference numerals and description thereof may be omitted.

Figure 3A:
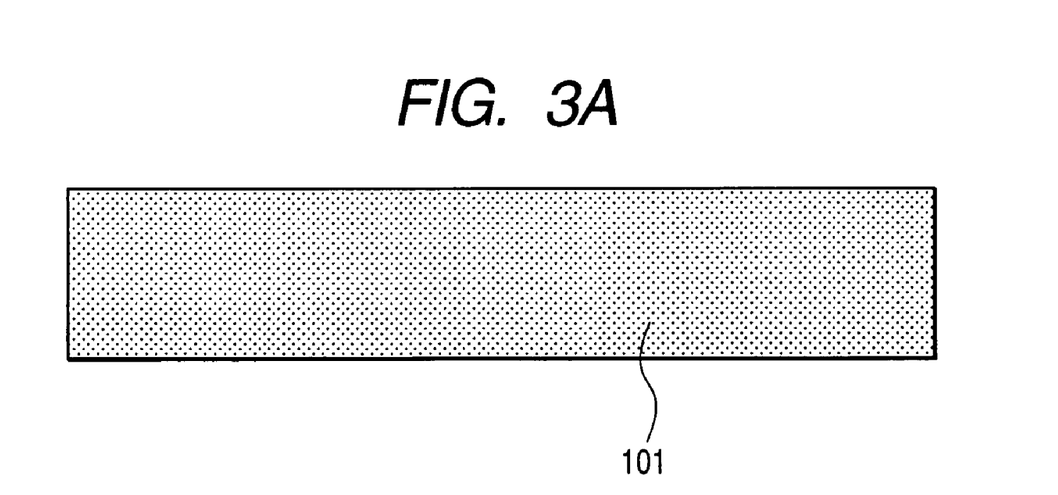
FIG. 3A is a drawing (No. 1) showing a production method for the semiconductor apparatus of Example 1.

First, in the process shown in FIG. 3A, a substrate 101 made of silicon (for example, silicon wafer) is prepared. For example, when the substrate 101 is formed of a silicon wafer, the thickness of the substrate 101 is about 600 to 800 micrometers. It is also possible that the substrate 101 may be grounded so as to have a predetermined thickness and used.

Figure 3B:
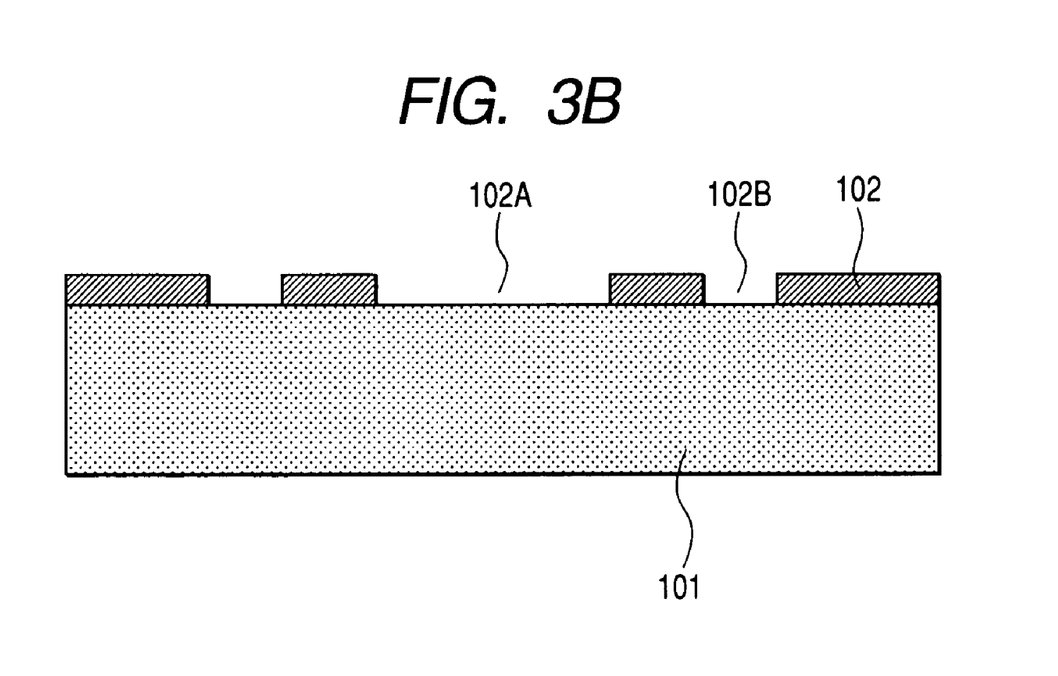
FIG. 3B is a drawing (No. 2) showing the production method for the semiconductor apparatus of Example 1.

Next, in the process shown in FIG. 3B, a mask pattern 102 having openings 102A and 102B is formed on the substrate 101. To form the mask pattern 102, a resist layer is formed by film affixing or coating, and the resist layer is exposed and developed. The opening 102A is formed at a position corresponding to the hole 101A to be formed in the subsequent process and the openings 102B are formed at a position corresponding to the via plugs 105 to be formed in the subsequent process.

Figure 3C:
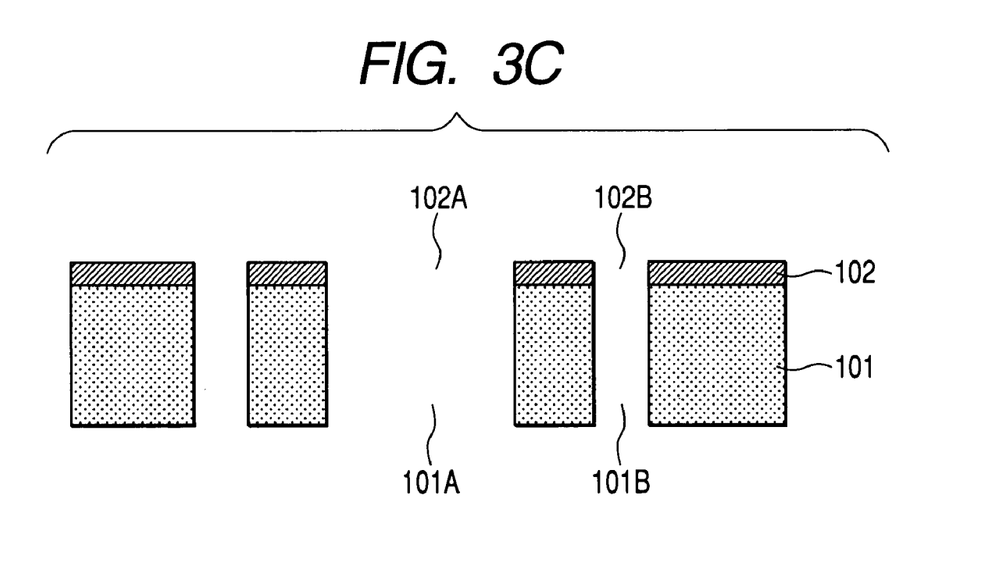
FIG. 3C is a drawing (No. 3) showing the production method for the semiconductor apparatus of Example 1.

Next, in the process shown in FIG. 3C, by using the mask pattern 102 as a mask, holes 101A and 101B perforating through the substrate 101 are formed by dry-etching (plasma etching) such as RIE (reactive ion etching). The etching may be performed by means of wet etching.

Figure 3D:
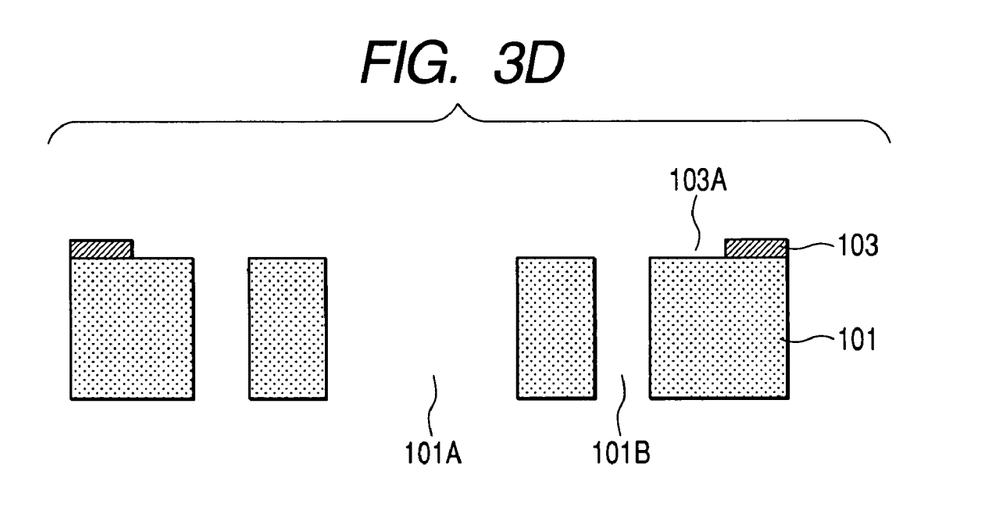
FIG. 3D is a drawing (No. 4) showing the production method for the semiconductor apparatus of Example 1.

Next, in the process shown in FIG. 3D, after separating the mask pattern 102, on the substrate 101, a mask pattern 103 having an opening 103A is newly formed. The mask pattern 103 is formed in the same manner as in the case of the mask pattern 102. That is, a resist layer is formed by film affixing or coating, and the resist layer is exposed and developed. The opening 103A is formed at a position corresponding to the concave portion 101C to be formed in the subsequent process.

Figure 3E:
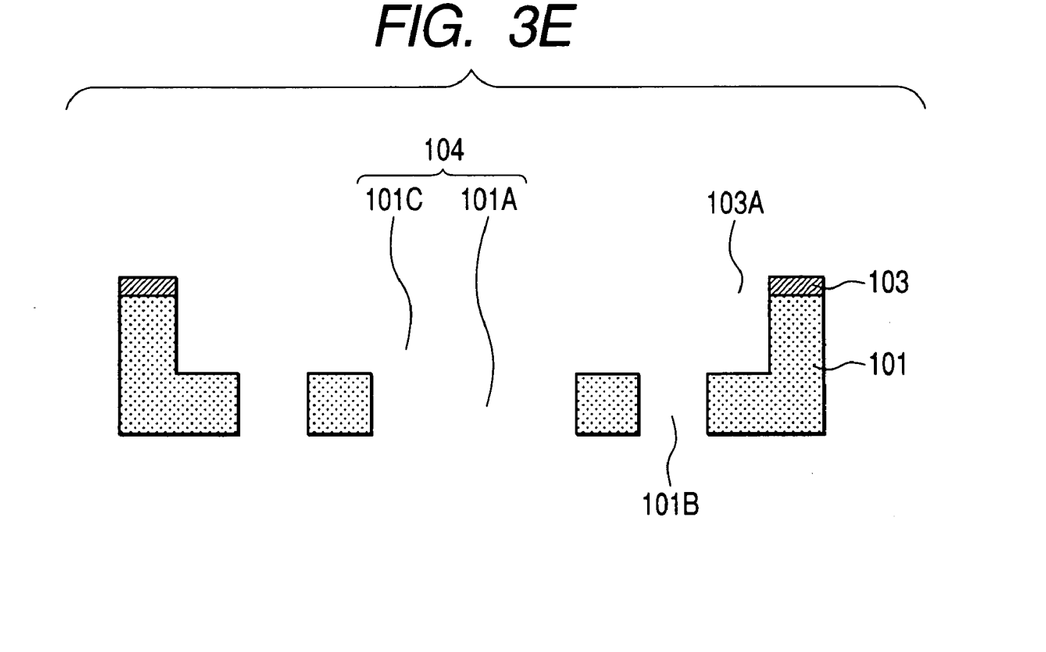
FIG. 3E is a drawing (No. 5) showing the production method for the semiconductor apparatus of Example 1.

Next, in the process shown in FIG. 3E, by etching (dry etching or wet etching) by using the mask pattern 103 as a mask, the concave portion 101C is formed at a portion corresponding to the opening 103A of the substrate 101. In this case, the lengths of the holes 101A and 101B formed in the process of FIG. 1C are reduced. As a result, the device housing space 104 consisting of the concave portion 101C and the hole 101A is formed in the silicon substrate 101.

Figure 3F:
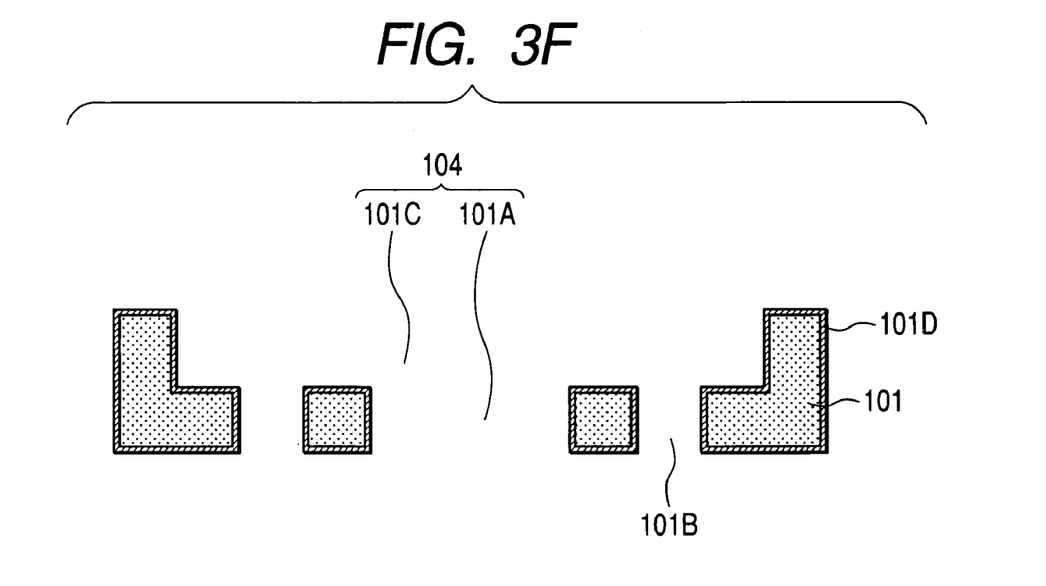
FIG. 3F is a drawing (No. 6) showing the production method for the semiconductor apparatus of Example 1.

Next, in the process of FIG. 3F, after separating the mask pattern 103, on the surface of the substrate 101, the insulating film 101D is formed. The insulating film 101D is formed of a silicon oxide film formed by, for example, thermally oxidizing silicon. The insulating film 101D is also formed on the inner wall surfaces of the holes 101B, whereby insulation between the conductive via plugs to be formed later and the substrate 101 is secured.

Figure 3G:
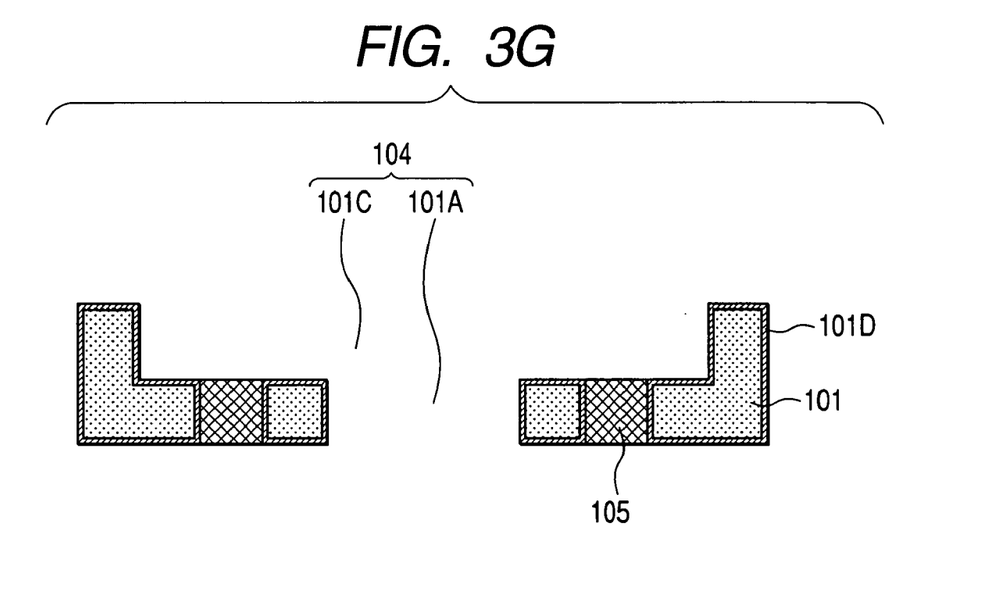
FIG. 3G is a drawing (No. 7) showing the production method for the semiconductor apparatus of Example 1.

Next, in the process shown in FIG. 3G, for example, according to a plating method, a conductive material such as Cu is embedded in the holes 101B to form the via plugs 105. In this case, after seed layers (feed layers) are formed by electroless plating, a mask pattern is formed, and via plugs 105 are formed by electrolytic plating using the seed layers as feed layers. After finishing electrolytic plating, the mask pattern and the seed layers are separated.

Figure 3H:
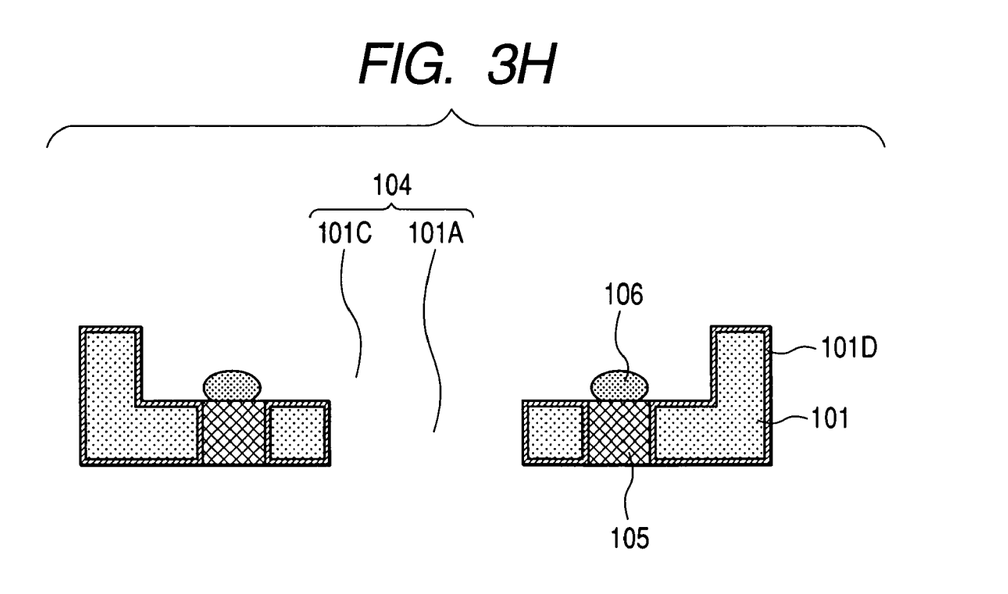
FIG. 3H is a drawing (No. 8) showing the production method for the semiconductor apparatus of Example 1.

Next, in the process shown in FIG. 3H, on the via plugs 105 on the device housing space 104 side, bumps 106 made of, for example, Au or solder are formed.

Figure 3I:
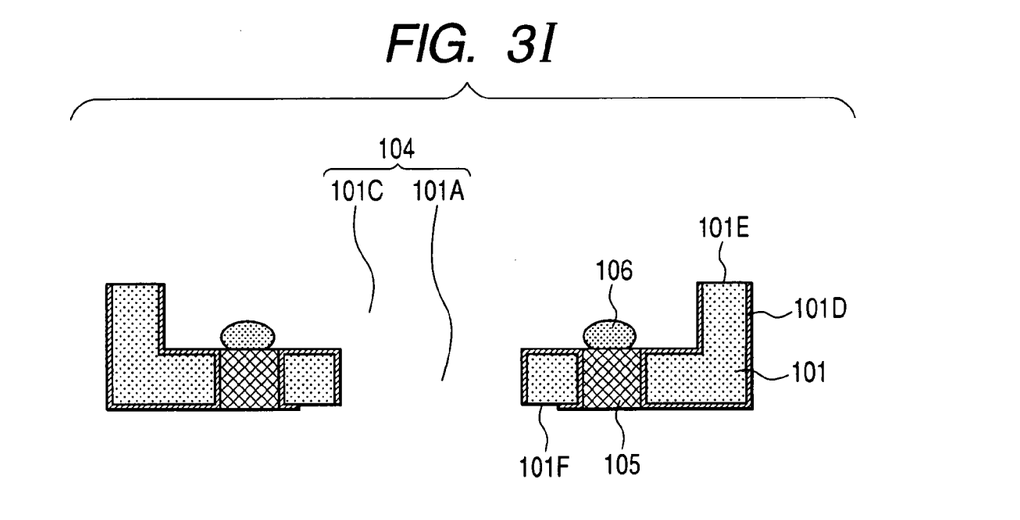
FIG. 3I is a drawing (No. 9) showing the production method for the semiconductor apparatus of Example 1.

Next, in the process shown in FIG. 3I, of the insulating film 101D formed on the surface of the silicon substrate 101, portions that become bonding surfaces to which the lids will be bonded in the subsequent process are removed (separated). For example, the oxide films at the bonding surfaces 101E around the opening of the concave portion 101C of the silicon substrate 101 and bonding surfaces 101F around the hole 101A are removed by wet etching or dry etching using a mask pattern.

Figure 3J:
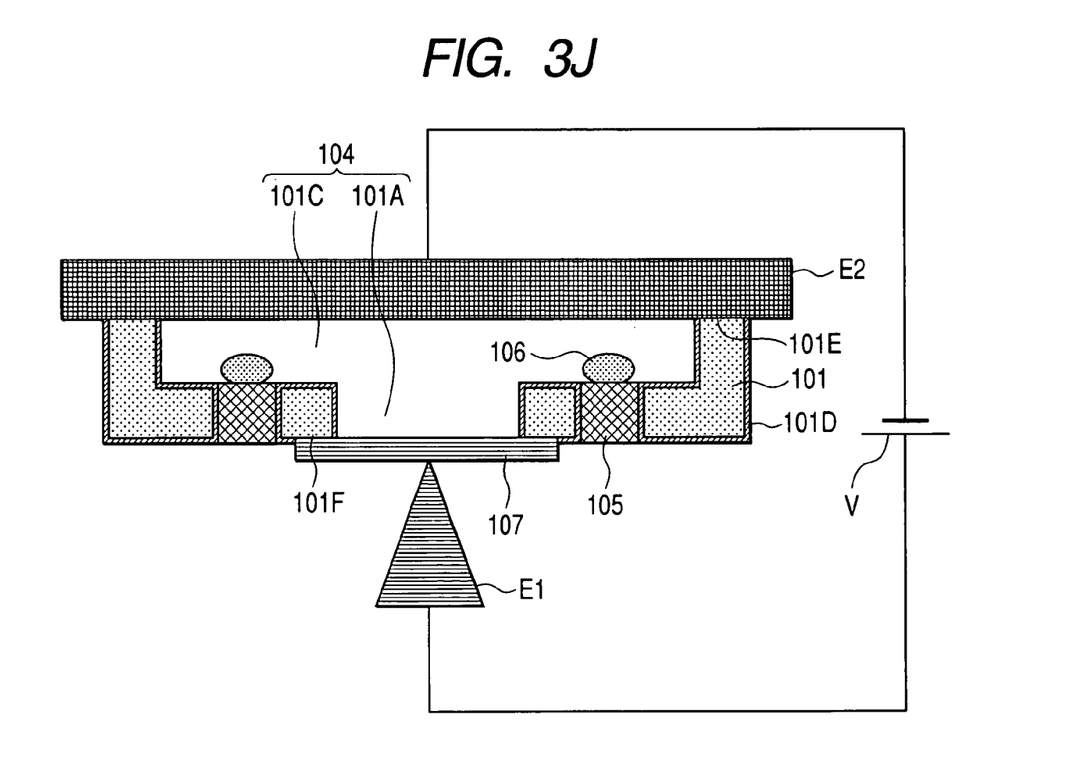
FIG. 3J is a drawing (No. 10) showing the production method for the semiconductor apparatus of Example 1.

Next, in the process shown in FIG. 3J, for example, by means of anodic bonding, the lid 107 formed of a plate-shaped glass is bonded to the silicon substrate 101 so as to seal the hole 101A. In this case, an anode electrode E1 and a cathode electrode E2 connected to a power supply V are connected to the lid (glass) 107 and the silicon substrate 101, and a high voltage is applied between the lid 107 and the silicon substrate 101 and they are heated, whereby the anodic bonding can be performed.

Figure 3K:
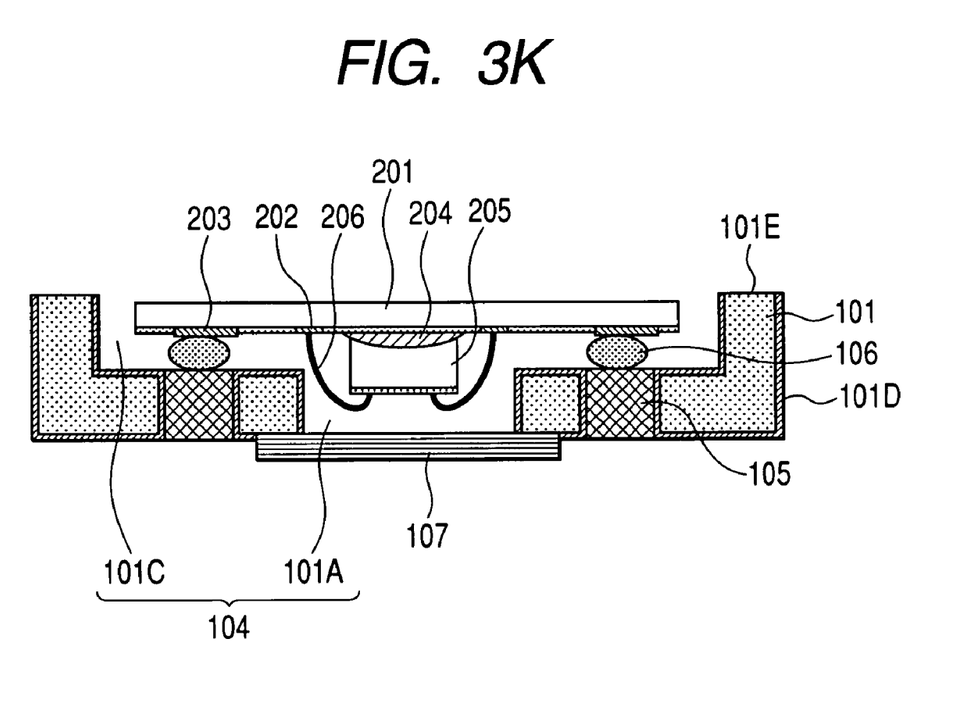
FIG. 3K is a drawing (No. 11) showing the production method for the semiconductor apparatus of Example 1.

Next, in the process shown in FIG. 3K, the laminated semiconductor devices 201 and 205 are packaged so as to be housed in the device housing space 104. In this case, the semiconductor device 205 formed of, for example, a MEMS device is bonded to the semiconductor device 201 by a paste (Ag paste or the like) so that it is laminated on the semiconductor device 201 formed of, for example, a driver device. Furthermore, the semiconductor device 205 and electrode pads 202 formed on the surfaces bonded to the semiconductor device 201 of the semiconductor device 201 are connected to the semiconductor device 205 by bonding wires 206 (such a semiconductor device lamination method will be described later).

Furthermore, on the semiconductor device 201, on the same surface as the surface on which the electrode pads 202 are formed, electrode pads 203 are formed, and the semiconductor device 201 (semiconductor device 205) is packaged so that the electrode pads 203 are connected to the via plugs 105 by means of the bumps 106.

Generally, the MEMS device (semiconductor device 205) is smaller than the driver device (semiconductor device 201), so that when packaging the MEMS device and the driver device, they are laminated and packaged so that the MEMS device corresponds to the hole 101A side and the driver device corresponds to the concave portion 101C.

Furthermore, in the subsequent process, the lid 108 shown in FIG. 2 is bonded by anodic bonding to the bonding surfaces 101E in the same manner as in the process shown in FIG. 3J. Furthermore, the bumps 109 shown in FIG. 2 are formed on the sides (outside the device housing space 104) opposite to the sides of the via plugs 105 on which the bumps 106 are formed as appropriate, whereby the semiconductor apparatus 100 shown in FIG. 2 can be produced.

In the above-described production method, in the silicon substrate 101 formed of a silicon wafer, the device housing space 104 having a large capacity is formed, and the laminated semiconductor devices 201 and 205 can be sealed therein. When the lids 107 and 108 are bonded to the substrate 101 by anodic bonding, influences such as mixing of contaminants such as organic matter into the sealed device housing space 104 are suppressed, so that the device housing space 104 can be maintained in a clean state.

The semiconductor devices 201 and 205 which are sealed within the device housing space 104 may be laminated, for example, as follows.

Figure 4A:
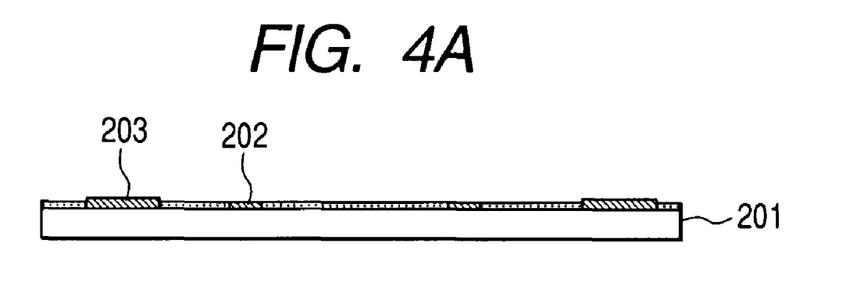
FIG. 4A is a drawing (No. 12) showing the production method for the semiconductor apparatus of Example 1.

First, in the process shown in FIG. 4A, the apparatus surface of the semiconductor device 201 on which the electrode pads 202 and 203 are formed is subjected to machining such as dicing or grinding as appropriate so as to make lamination of the semiconductor device possible.

Figure 4B:
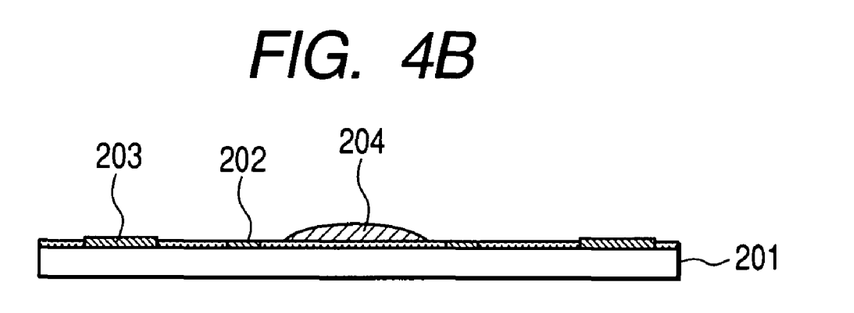
FIG. 4B is a drawing (No. 13) showing the production method for the semiconductor apparatus of Example 1.

Next, in the process shown in FIG. 4B, on the apparatus surfaces, a paste 204 made of, for example, Ag paste is coated.

Figure 4C:
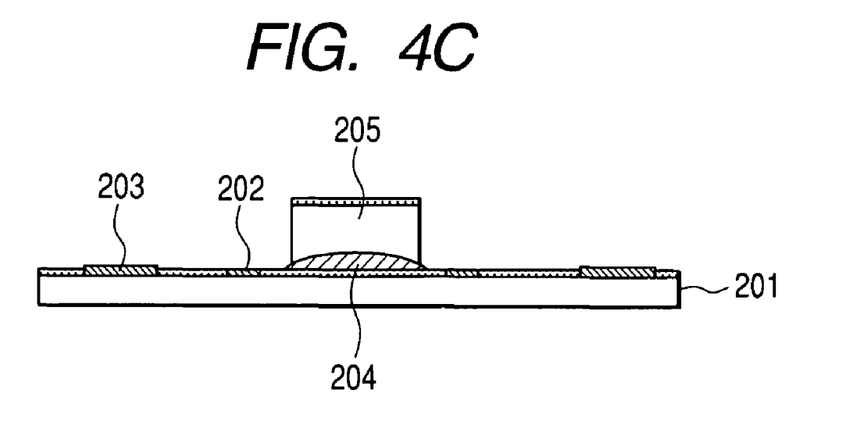
FIG. 4C is a drawing (No. 14) showing the production method for the semiconductor apparatus of Example 1.

Next, in the process shown in FIG. 4C, the semiconductor device 205 is mounted on the paste 204, and furthermore, the paste 204 is cured so that the semiconductor device 205 is stably set on the semiconductor device 201.

Figure 4D:
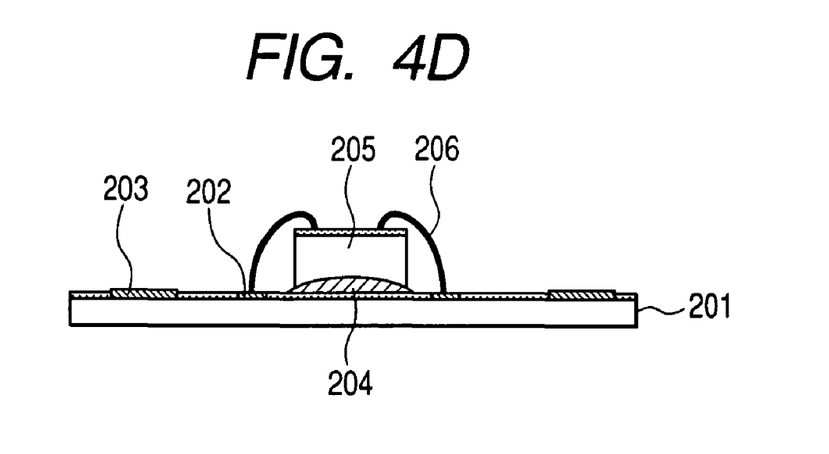
FIG. 4D is a drawing (No. 15) showing the production method for the semiconductor apparatus of Example 1.

Next, in the process shown in FIG. 4D, by using, for example, a wire bonder, the semiconductor device 205 and the electrode pads 202 (semiconductor device 201) are connected by bonding wires 206. Thereby, the structure in which the semiconductor device 205 is laminated on the semiconductor device 201 as shown in the process of FIG. 3K can be formed. The connection of the semiconductor device to be laminated is not limited to wire bonding, and may be, for example, flip-chip connection.

Example 2

Figure 5:
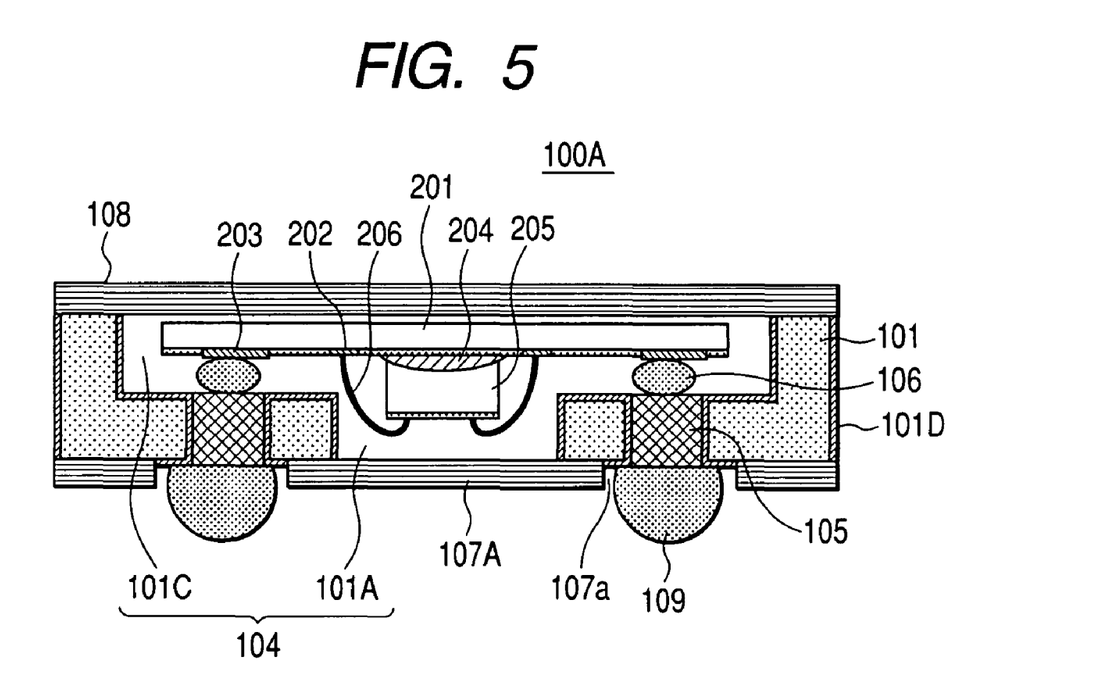
FIG. 5 shows a semiconductor apparatus of Example 2.

FIG. 5 is a sectional view schematically showing a semiconductor apparatus 100A of Example 2 of the present invention. However, the aforementioned components are attached with the same symbols, and description thereof is omitted. The structure that is not especially described herein is the same as in Example 1, and can be produced according to the same production method as in Example 1.

Referring to FIG. 5, in the case of the semiconductor apparatus 100A of this embodiment, the lid 107A corresponding to the lid 107 of Example 1 is larger than in the case of Example 1, and in the lid 107A, openings 107a for exposing the bumps 109 are formed. Thus, the shape, size, and material of the lids can be variously altered and changed.

For example, the material for forming the lids 107 and 108 is not limited to glass (optically-transparent material), and may be other materials such as silicon. In this case, to bond the silicon substrate 101 and the lids, by forming a film for bonding made of, for example, Au, Cu, or Ni on both or either of the silicon substrate and the lids, it becomes possible to easily bond the lids and the substrate.

In the above-described Example 1 and Example 2, one semiconductor apparatus is illustrated, however, in actual semiconductor apparatus production, a plurality of device housing spaces and via plugs are formed in one substrate (wafer) and packages for packaging semiconductor apparatus are formed, and in a subsequent process, the substrate is cut and the packages are separated into the respective pieces. Furthermore, semiconductor devices are packaged into the respective separated packages, whereby semiconductor apparatus are produced.

The present invention is described above based on preferred examples, however, the present invention is not limited to the above-described specific examples, and can be variously altered and changed within the spirit described in the claims.

For example, the semiconductor devices to be packaged are not limited to the MEMS device and the driver device, and may be other various semiconductor devices. For example, when the lid 107 is made of an optically transparent material such as glass, as the semiconductor device 205, an optical functional device such as a light emitting device or a light receiving device may be used.

According to the present invention, a semiconductor apparatus having a structure in which semiconductor devices are sealed can be downsized.

More specifically, it is possible to form a large region for sealing the devices by using an inexpensive silicon substrate. For example, as in the case where a silicon wafer that is readily available for inexpensive cost is used, but the thickness of the substrate is limited, by employing the above-described structure, a large device housing space can be secured. Therefore, a semiconductor apparatus in which a plurality of laminated semiconductor devices are sealed can be downsized at a low cost.

In addition, the device housing space is constructed by a combination of the concave portion and the hole so that so-called "stepped shape" is formed in the device housing space. In this "stepped shape" portion, a via plugs is formed to secure the connection between the semiconductor devices to be sealed and the outside of the device housing space.

For example, the MEMS device as a kind of semiconductor devices is preferably operated with sealing it in a predetermined space in view of the stable operation and long life of the device.

Therefore, according to the present invention, it becomes possible to provide a downsized semiconductor apparatus including at least a MEMS device and its driver device in view of the demands of device precision and economical production cost.

The present invention having been described with reference to the foregoing embodiments should not be limited to the disclosed embodiments and modifications, but may be implemented in many ways without departing from the spirit of the invention.

What is claimed is:

1. A semiconductor apparatus including:
   a silicon substrate;
   a device housing space including a concave portion formed in the silicon substrate and a hole formed adjacent to and touching a bottom surface of the concave portion;
   a plurality of semiconductor devices provided in the device housing space, the semiconductor devices comprising a first semiconductor device and a second semiconductor device;
   a first lid which seals the concave portion and a second lid which seals the hole so as to seal the semiconductor devices in the device housing space, and
   via plugs which are connected to any one of the plurality of semiconductor devices while penetrating the bottom surface of the concave portion,
   the first semiconductor device is mounted in the hole and the second semiconductor device is mounted in the concave portion,
   the first semiconductor device is mounted on an active face of the second semiconductor device and electrically connected to the second semiconductor device, and the second semiconductor device is housed in the concave portion such that the active face thereof is opposed to the bottom surface of the concave portion, and electrically connected to the via plugs, wherein electrical connections are made in the active face, and a connection pad and a wire are provided on the active face.

2. The semiconductor apparatus according to claim 1, wherein the plurality of semiconductor devices include a MEMS device and a driver device used for the MEMS device.

3. The semiconductor apparatus according to claim 2, wherein the driver device is connected to the via plugs on a laminated side of the MEMS device.

4. The semiconductor apparatus according to claim 1, wherein the first lid and the second lid are made of glass.

5. The semiconductor apparatus according to claim 4, wherein the first lid and the second lid are bonded to the silicon substrate by anodic bonding.

* * * * *